United States Patent
Kwon et al.

(10) Patent No.: US 10,946,483 B2
(45) Date of Patent: Mar. 16, 2021

(54) LASER APPARATUS AND METHOD OF DICING A SUBSTRATE USING THE SAME

(71) Applicant: Samsung Electronics Co., Ltd., Suwon-si (KR)

(72) Inventors: Young-Chul Kwon, Asan-si (KR); Man-Hee Han, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/517,789

(22) Filed: Jul. 22, 2019

(65) Prior Publication Data
US 2020/0298346 A1 Sep. 24, 2020

(30) Foreign Application Priority Data
Mar. 19, 2019 (KR) .................. 10-2019-0031062

(51) Int. Cl.
| | |
|---|---|
| *B23K 26/53* | (2014.01) |
| *H01L 21/78* | (2006.01) |
| *B23K 26/06* | (2014.01) |
| *B23K 26/073* | (2006.01) |
| *B23K 26/067* | (2006.01) |
| *B23K 26/08* | (2014.01) |
| *B23K 26/70* | (2014.01) |

(52) U.S. Cl.
CPC .......... *B23K 26/53* (2015.10); *B23K 26/0652* (2013.01); *B23K 26/0676* (2013.01); *B23K 26/0738* (2013.01); *B23K 26/0853* (2013.01); *H01L 21/78* (2013.01); *B23K 26/0648* (2013.01); *B23K 26/707* (2015.10)

(58) Field of Classification Search
None
See application file for complete search history.

(56) References Cited

U.S. PATENT DOCUMENTS

| | | | |
|---|---|---|---|
| 7,907,341 B2 | 3/2011 | Kakui et al. | |
| 8,852,698 B2 | 10/2014 | Fukumitsu | |
| 9,102,007 B2 | 8/2015 | Hosseini | |
| 9,196,536 B1 | 11/2015 | Park et al. | |
| 9,751,154 B2 | 9/2017 | Bovatsek et al. | |
| 10,144,088 B2 | 12/2018 | Hosseini | |
| 2002/0130245 A1* | 9/2002 | Fujimoto | C03B 33/0222 250/205 |
| 2016/0315010 A1* | 10/2016 | Van Der Stam | H01L 21/78 |
| 2017/0320165 A1* | 11/2017 | Hyakumura | G01B 11/00 |
| 2020/0164463 A1* | 5/2020 | Shibazaki | B23K 26/0344 |

FOREIGN PATENT DOCUMENTS

| | | |
|---|---|---|
| JP | 2008105096 A | 5/2008 |
| KR | 101259580 A | 4/2013 |
| KR | 101825922 A | 1/2018 |

* cited by examiner

*Primary Examiner* — Steven B Gauthier
(74) *Attorney, Agent, or Firm* — Muir Patent Law, PLLC (57) ABSTRACT

A laser apparatus may include a spectrum controller and a spectrum modulator. The spectrum controller may control a center wavelength and/or a bandwidth of a spectrum of a laser beam. The spectrum modulator may modulate the spectrum of the laser beam having the center wavelength and/or the bandwidth controlled by the spectrum controller. Thus, the laser beam may have the spectrum optimal for a semiconductor fabrication process. Particularly, the substrate may be accurately diced using the laser beam having the optimal spectrum.

4 Claims, 10 Drawing Sheets

LASER APPARATUS AND METHOD OF DICING A SUBSTRATE USING THE SAME

CROSS-RELATED APPLICATION

This application claims priority under 35 U.S.C. § 119 to Korean Patent Application No. 10-2019-0031062, filed on Mar. 19, 2019, in the Korean Intellectual Property Office (KIPO), the contents of which are herein incorporated by reference in their entirety.

BACKGROUND

1. Field

Example embodiments relate to a laser apparatus, and an apparatus and a method of dicing a substrate using the same. More particularly, example embodiments relate to a laser apparatus configured to generate a laser used in semiconductor fabrication processes, and an apparatus and a method of dicing a substrate using the laser apparatus.

2. Description of the Related Art

After forming a plurality of semiconductor chips on a semiconductor substrate, a laser beam generated from a laser apparatus may be irradiated to a scribe lane of the semiconductor substrate to dice the semiconductor substrate.

According to related arts, the laser apparatus may include a laser source, a beam modulator, and an optical lens. A spectrum of the laser beam generated from the laser source may be changed due to low function of a gain fiber, damages of a fiber grating, etc. Thus, the laser beam may not have an optimal spectrum for accurately dicing the semiconductor substrate.

SUMMARY

Example embodiments provide a laser apparatus that may be capable of generating a laser beam having a spectrum optimized in a semiconductor fabrication process.

Example embodiments also provide an apparatus for dicing a substrate using the above-mentioned laser apparatus.

Example embodiments still also provide a method of dicing a substrate using the above-mentioned laser apparatus.

According to example embodiments, the disclosure is directed to a laser apparatus comprising: a spectrum controller for controlling at least one of a center wavelength and a bandwidth of a spectrum of a laser beam; and a spectrum modulator for modulating the spectrum of the laser beam having the at least one of the center wavelength and the bandwidth controlled by the spectrum controller.

According to example embodiments, the disclosure is directed to an apparatus for dicing a substrate, the apparatus comprising: a spectrum controller for controlling at least one of a center wavelength and a bandwidth of a spectrum of a laser beam; and an optical lens for focusing the laser beam, which has the spectrum having at least one of the center wavelength and the bandwidth controlled by the spectrum controller, on the substrate.

According to example embodiments, the disclosure is directed to a method of dicing a substrate, the method comprising: controlling at least one of a center wavelength and a bandwidth of a spectrum of a laser beam; and focusing the laser beam, which has the spectrum having the at least one of the center wavelength and the bandwidth controlled by a spectrum controller, on the substrate.

BRIEF DESCRIPTION OF THE DRAWINGS

Example embodiments will be more clearly understood from the following detailed description taken in conjunction with the accompanying drawings. FIGS. 1 to 15 represent non-limiting, example embodiments as described herein.

DETAILED DESCRIPTION OF THE EMBODIMENTS

Hereinafter, example embodiments will be explained in detail with reference to the accompanying drawings.

Laser Apparatus

Figure 1:
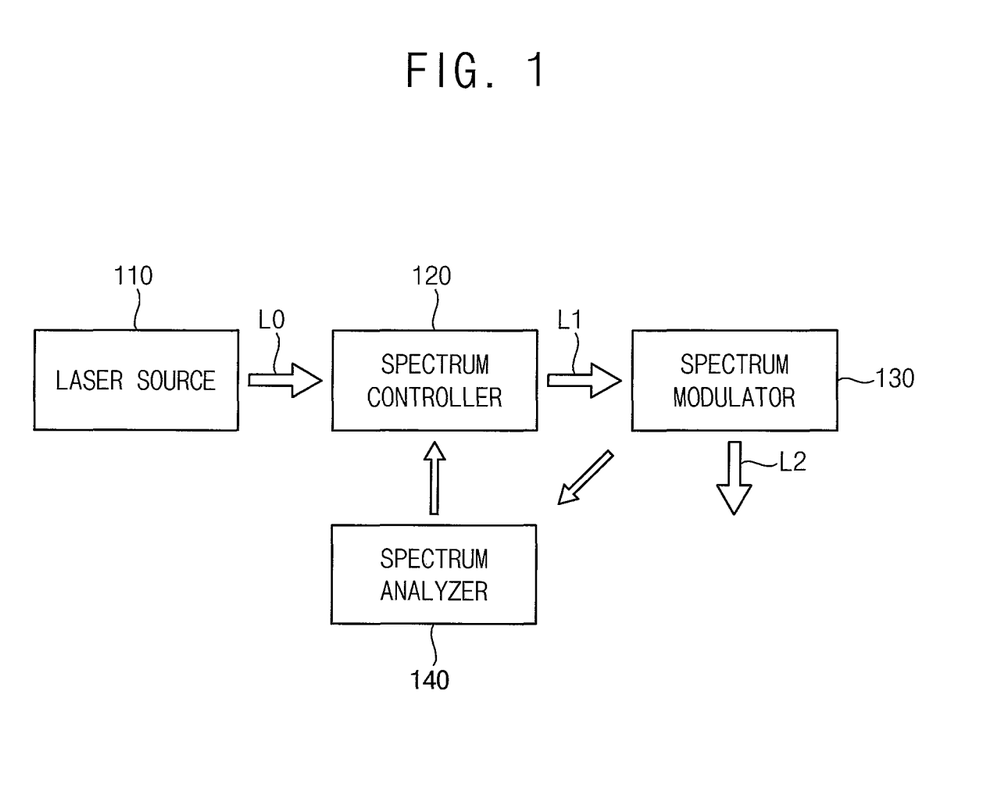
FIG. 1 is a block diagram illustrating a laser apparatus in accordance with example embodiments.

FIG. 1 is a block diagram illustrating a laser apparatus in accordance with example embodiments.

Referring to FIG. 1, a laser apparatus of this example embodiment may include a laser source 110, a spectrum controller 120, a spectrum modulator 130, and a spectrum analyzer 140.

The laser source 110 may generate a laser beam L0. The laser source 110 may include a laser diode. The laser diode may generate a laser using a forward semiconductor junction as an active medium. For example, when a current may be supplied to the laser diode, a reversal may be generated between a high energy level of a density and a low energy level of a density in the semiconductor junction to emit the laser beam L0.

In example embodiments, the laser source 110 may include a master oscillator-power amplifier (MO-PA) type laser source. The MO-PA type laser source may generate the laser beam L0 having a Gaussian shape. The MO-PA type laser source may include the master oscillator corresponding to a longitudinal light source, the power amplifier, and a switch. The longitudinal light source may include a continuous light generator configured to emit a continuous light. For example, the continuous light generator may include the laser diode, a Fabry-Perot type fiber laser apparatus, a solid laser apparatus, etc. For example, the switch may include an acousto-optic (A/O) element, which can be controlled by an externally-supplied electrical signal. The switch may control the continuous light generator so that the continuous light generator may repeatedly generate the continuous light having low loss state and high loss state.

In example embodiments, the laser beam L0 may have a spectrum S0. The spectrum S0 may have a center wavelength C0 and a bandwidth B0. The laser beam L0 may be used for semiconductor fabrication processes. Further, the laser beam L0 may have a pulse width of about 100 femtoseconds to about 1 nanosecond. A laser beam having a pulse width of no less than about several picoseconds among the laser beams may mainly generate an optical reaction as a non-thermal reaction. Thus, the laser beam having a pulse width of no less than about several picoseconds may be used for a high accuracy machining process such as a substrate dicing process. When the laser beam L0 having the pulse width of no less than about several femtoseconds may be amplified, the amplified laser beam may have an output of no less than a terawatt. Further, a photo energy of the laser beam L0 may be concentrated on one point without concentrating the laser beam L0 on only one point so that the laser beam L0 may be used in the high accuracy machining process. In order to increase an absorption ratio of the laser beam L0 in a substrate 10 such as a semiconductor substrate, a glass substrate, etc., the laser beam L0 may have a wavelength of about 100 nm to about 1,100 nm.

The spectrum controller 120 may control the center wavelength C0 and/or the bandwidth B0 of the spectrum S0 of the laser beam L0 generated from the laser source 110. Thus, the laser beam L0 may pass through the spectrum controller 120 to form a first laser beam L1 having a first spectrum S1. The first spectrum S1 of the first laser beam L1 may have a first center wavelength C1 and/or a first bandwidth B1 different from the center wavelength C0 and/or the bandwidth B0 of the spectrum S0 of the laser beam L0.

The spectrum modulator 130 may modulate the first spectrum S1 of the first laser beam L1 controlled by the spectrum controller 120 to form a second laser beam L2 having a second spectrum.

The spectrum analyzer 140 may analyze the second spectrum of the second laser beam L2 modulated by the spectrum modulator 130. Information of the second spectrum of the second laser beam L2 analyzed by the spectrum analyzer 140 may be transmitted to the spectrum controller 120. For example, the spectrum analyzer 140 may measure the magnitude (e.g., amplitude or strength) of the second spectrum of the second laser beam L2 modulated by the spectrum modulator 130. Although not illustrated, the spectrum analyzer 140 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the spectrum analyzer 140 (e.g., keyboard, mouse, display, speakers, printers, modems, network cards, etc.), and storage media or other suitable type of memory (e.g., such as, for example, RAM, ROM, programmable ROM (PROM), erasable PROM (EPROM), electrically erasable PROM (EEPROM), magnetic disks, optical disks, hard disks, removable cartridges, flash drives, any type of tangible and non-transitory storage medium) where data and/or instructions can be stored. In addition, the spectrum analyzer 140 can include antennas, network interfaces that provide wireless and/or wire line digital and/or analog interface to one or more networks over one or more network connections (not shown), a power source that provides an appropriate alternating current (AC) or direct current (DC) to power one or more components of the spectrum analyzer 140, and a bus that allows communication among the various disclosed components of the spectrum analyzer 140.

Figure 2:
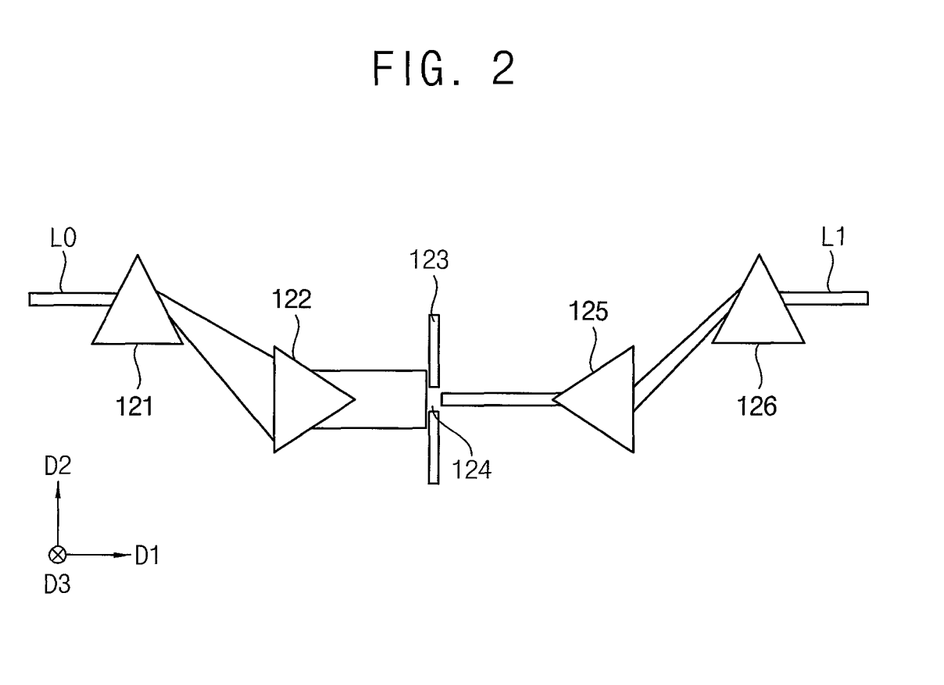
FIG. 2 is a view illustrating a spectrum controller of the laser apparatus in FIG. 1.
Figure 3:
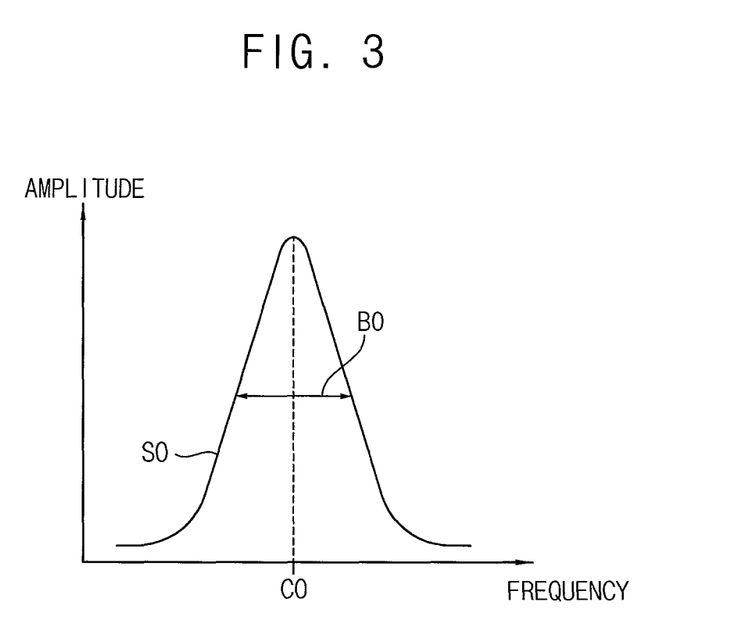
FIG. 3 is a view illustrating a spectrum of a laser beam generated from a laser source of the laser apparatus in FIG. 1.
Figure 4:
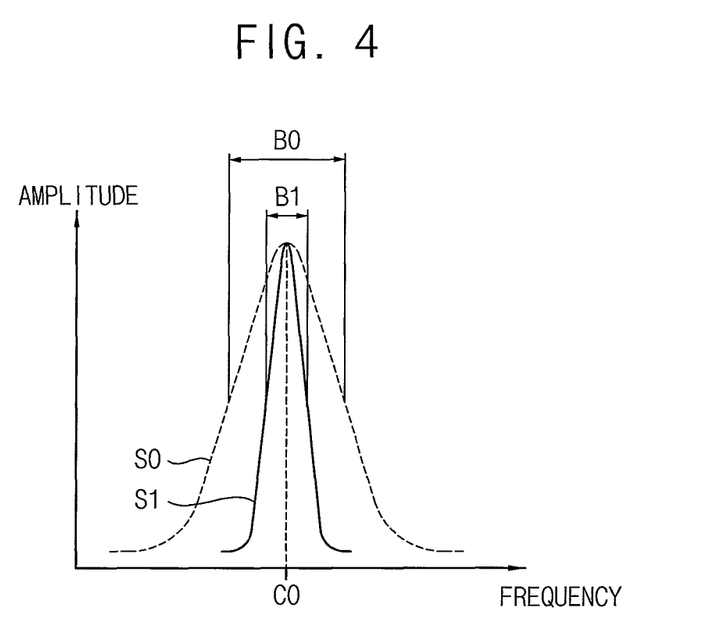
FIG. 4 is a view illustrating a bandwidth of a spectrum changed from a bandwidth of the spectrum in FIG. 3 by the spectrum controller in FIG. 2.
Figure 5:
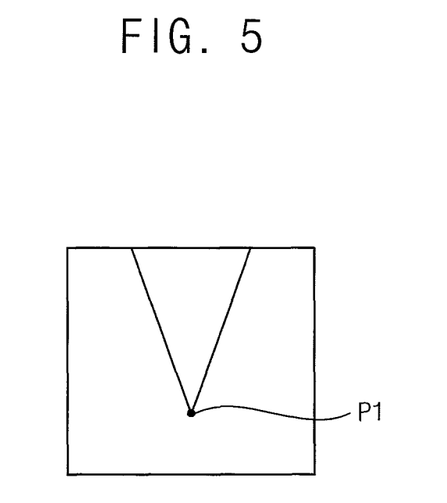
FIG. 5 is a view illustrating a concentrated spectrum in FIG. 4.

FIG. 2 is a view illustrating the spectrum controller 120 of the laser apparatus in FIG. 1, FIG. 3 is a view illustrating a spectrum of a laser beam generated from a laser source of the laser apparatus in FIG. 1, FIG. 4 is a view illustrating a bandwidth of a spectrum changed from a bandwidth of the spectrum in FIG. 3 by the spectrum controller 120 in FIG. 2, and FIG. 5 is a view illustrating a concentrated spectrum in FIG. 4.

Referring to FIG. 2, the spectrum controller 120 may include a first prism 121, a second prism 122, a control plate 123, a third prism 125, and a fourth prism 126.

The control plate 123 may be vertically arranged between the laser source 110 and the spectrum modulator 130. For example, the laser source 110 and the spectrum modulator 130 may be arranged in a first direction D1, and the control plate 123 may be provided between the laser source 110 and the spectrum modulator 130 in the first direction D1 such that the surface of the control plate 123 that faces the second prism 122 is substantially parallel to the second direction D2. As used herein, terms such as "same," "equal," or "parallel" encompass near identicality including variations that may occur, for example, due to or as a result of manufacturing processes. Similarly, terms such as "orthogonal" or "perpendicular" encompass angles that are 90 degrees with respect to a given line, plane, or surface and include variations that may occur, for example, due to or as a result of manufacturing processes. The term "substantially" may be used herein to emphasize these meanings, unless the context or other statements indicate otherwise.

The control plate 123 may have a slit 124 through which the laser beam L0 may pass. The slit 124 may have a rectangular shape that extends lengthwise in the third direction D3. For example, a length of the slit 124 in the third direction D3 may be greater than a width of the slit 124 in the second direction D2. Further, the control plate 123 may be moved in a vertical direction. For example, the control plate 123 may be moved up and/or down in the second direction D2. In some embodiments, the control plate 123 may be moved up and/or down in the second direction D2 while the laser beam may pass through the slit 124.

The first prism 121 and the second prism 122 may be sequentially arranged between the laser source 110 and the control plate 123. The first prism 121 may disperse the laser beam L0 emitted from the laser source 110. The second prism 122 may provide the dispersed laser beam L0 with directionality substantially perpendicular to a surface of the control plate 123. For example, the second prism 122 may be arranged between the first prism 121 and the control plate 123 to provide the dispersed laser beam L0 in the first direction D1 to be substantially orthogonal to the surface of the control plate 123. Thus, the laser beam L0 passing through the second prism 122 may be vertically incident on the surface of the control plate 123.

As shown in FIG. 3, the spectrum S0 of the laser beam L0 may have the center wavelength C0 and the bandwidth B0. When the laser beam L0 passes through the slit 124 of the control plate 123, the first laser beam L1 may have the first spectrum S1 having the first bandwidth B1 narrower than the bandwidth B0, as shown in FIG. 4. Thus, as shown in FIG. 5, the first laser beam L1 may be focused on a first point P1.

By passing the laser beam L0 through the slit 124, the first spectrum S1 of the first laser beam L1 may have the first bandwidth B1 different from the bandwidth B0 of the spectrum S0 of the laser beam L0. Therefore, when a size optimal for a semiconductor fabrication process such as a dicing process is provided to the slit 124, the first bandwidth B1 optimal for the dicing process may be provided to the first spectrum S1 of the first laser beam S1. For example, the optimal first laser beam L1 may be formed by changing the size of the slit 124. For example, a width of the slit 124 in the second direction D2 may be increased or decreased to change the size of the bandwidth of the first laser beam L1. In some embodiments, the size of the slit 124 may be changed while the laser beam L0 passes through the slit 124.

Figure 6:
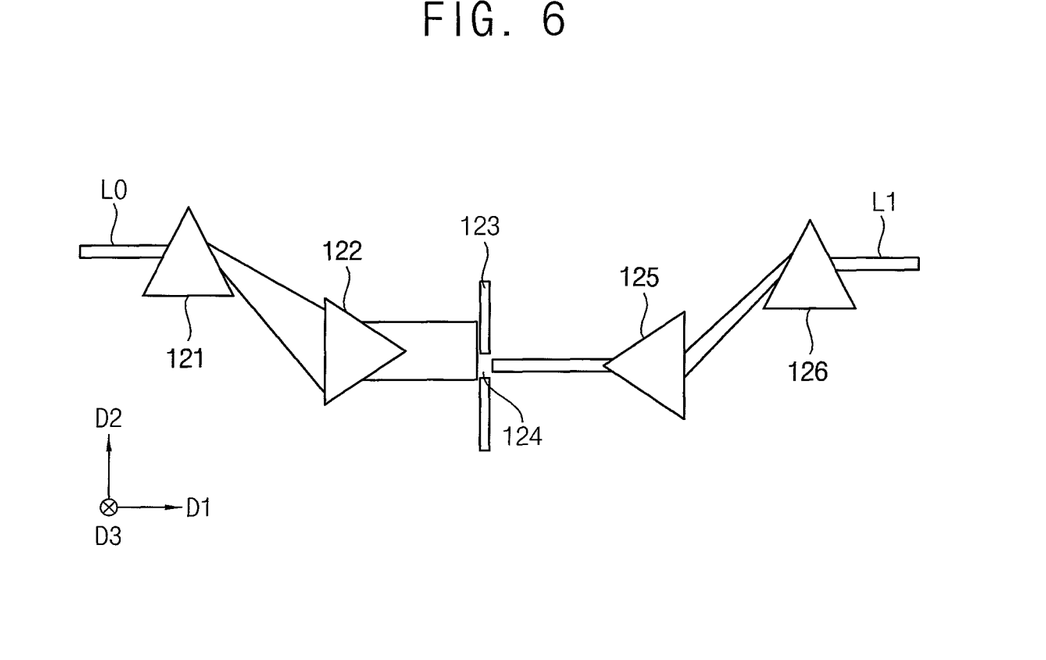
FIG. 6 is a view illustrating a center wavelength of a spectrum changed from a center wavelength of the spectrum in FIG. 3 by the spectrum controller in FIG. 2.
Figure 7:
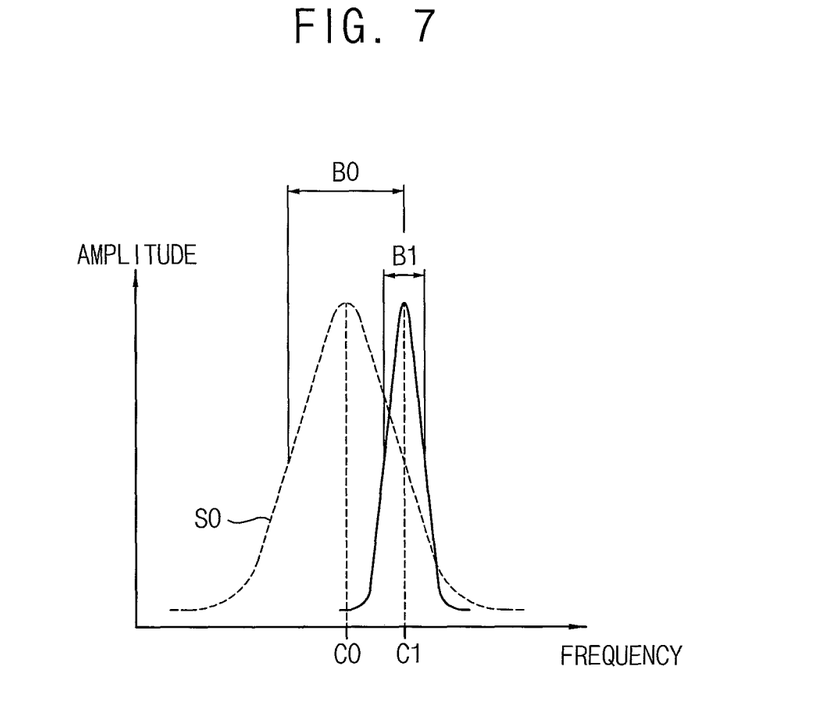
FIG. 7 is a view illustrating a concentrated spectrum in FIG. 6.

FIG. 6 is a view illustrating a center wavelength of a spectrum changed from a center wavelength of the spectrum in FIG. 3 by the spectrum controller in FIG. 2, and FIG. 7 is a view illustrating a concentrated spectrum in FIG. 6.

Referring to FIG. 6, the control plate 123 may be moved downward in the vertical direction. For example, the control plate 123 may be moved downward in the second direction D2. The slit 124 may also be moved downward together with the control plate 123. For example, when the control plate 123 is moved downward in the second direction D2, the slit 124 also may be moved downward in the second direction D2. Thus, when the laser beam L0 passes through the slit 124 of the control plate 123, the center wavelength C0 of the spectrum S0 of the laser beam L0 may be moved right, as shown in FIG. 7. As a result, the first spectrum S1 of the first laser beam L1 formed by passing the laser beam L0 through the slit 124 may have the first center wavelength C1 positioned to the right of the center wavelength C0 of the laser beam L0.

In contrast, the control plate 123 may be moved upward in the vertical direction. For example, the control plate 123 may be moved upward in the second direction D2. The slit 124 may also be moved upward together with the control plate 123. For example, when the control plate 123 is moved upward in the second direction D2, the slit 124 also may be moved upward in the second direction D2. Thus, when the laser beam L0 passes through the slit 124 of the control plate 123, the center wavelength C0 of the spectrum S0 of the laser beam L0 may be moved left. As a result, the first spectrum S1 of the first laser beam L1 formed by passing the laser beam L0 through the slit 124 may have the first center wavelength C1 positioned to the left of the center wavelength C0 of the laser beam L0.

By moving the control plate 123 in the vertical direction, the first spectrum S1 of the first laser beam L1 may have the first center wavelength C1 different from the center wavelength C0 of the laser beam L0. For example, the first wavelength C1 optimal for a semiconductor fabrication process such as a dicing process may be provided to the first spectrum S1 of the first laser beam S1 by moving the control plate 123 in the vertical direction.

In the example of FIGS. 6 and 7, the slit 124 has the same size as in the example of FIGS. 2-4, but the embodiments are not limited thereto. For example, in some embodiments, in addition to moving the control plate upward or downward in the vertical direction, the size of the slit 124 may also be increased or decreased.

Referring to FIG. 2, the third prism 125 and the fourth prism 126 may be sequentially arranged between the control plate 123 and the spectrum modulator 130. The third prism 125 and the fourth prism 126 may function so as to return the first laser beam L1 formed by the control plate 123 to an original optical path (e.g., the optical path of laser beam L0). The first laser beam L1 formed by the control plate 123 may be incident on the spectrum modulator 130.

Figure 8:
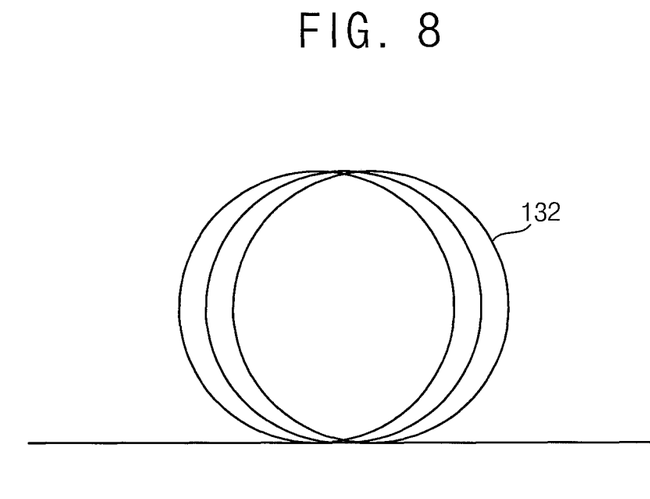
FIG. 8 is a view illustrating a Raman optical fiber used as a spectrum modulator of the laser apparatus in FIG. 1.
Figure 9:
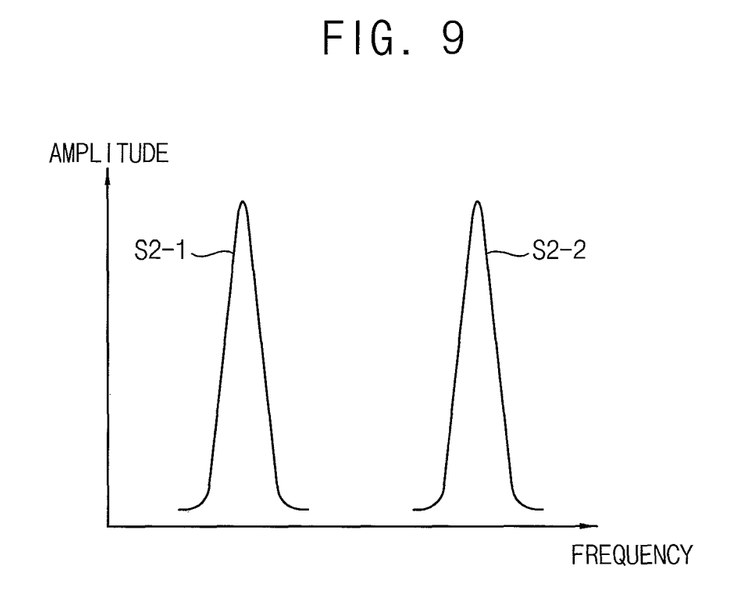
FIG. 9 is a view illustrating two spectrums divided by the Raman optical fiber in FIG. 8.
Figure 10:
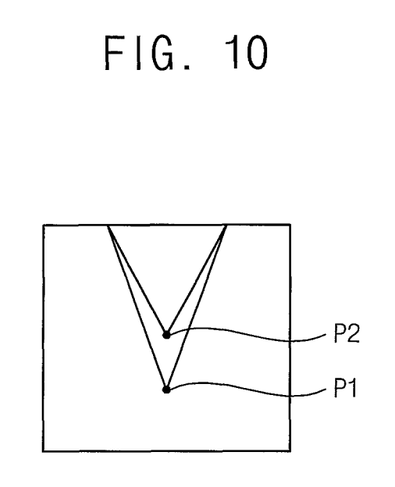
FIG. 10 is a view illustrating a multi-concentrated spectrum in FIG. 9.

FIG. 8 is a view illustrating a Raman optical fiber used as a spectrum modulator of the laser apparatus in FIG. 1, FIG. 9 is a view illustrating two spectrums divided by the Raman optical fiber in FIG. 8, and FIG. 10 is a view illustrating a multi-concentrated spectrum in FIG. 9.

Referring to FIGS. 8 and 9, the spectrum modulator 130 of this example embodiment may modulate the first spectrum S1 of the first laser beam L1 formed by the spectrum controller 120.

In example embodiments, the spectrum modulator 130 may include a Raman optical fiber 132. The Raman optical fiber 132 may scatter one laser beam to divide the laser beam into at least two laser beams. Thus, when the first laser beam L1 formed by the spectrum controller 120 passes through the Raman optical fiber 132, the first spectrum S1 of the first laser beam L1 may be changed into the second laser beam L1 having two second spectrums S2-1 and S2-2. For example, the two second spectrums S2-1 and S2-2 of the second laser beam L2 may have different center wavelengths. As a result, the first laser beam L1 having one first center wavelength C1 may be converted into the second laser beam L2 having the two center wavelengths. However, the spectrum modulator 130 may include other optical elements that, in addition to the Raman optical fiber 132, can convert the laser beam into a laser beam having at least two center wavelengths.

Therefore, as shown in FIG. 10, the second laser beam L2 having the two center wavelengths may be focused on a first point P1 and a second point P2. The number of focusing points of the second laser beam L2 may be determined according to the number of center wavelengths divided by the Raman optical fiber 132.

Figure 11:
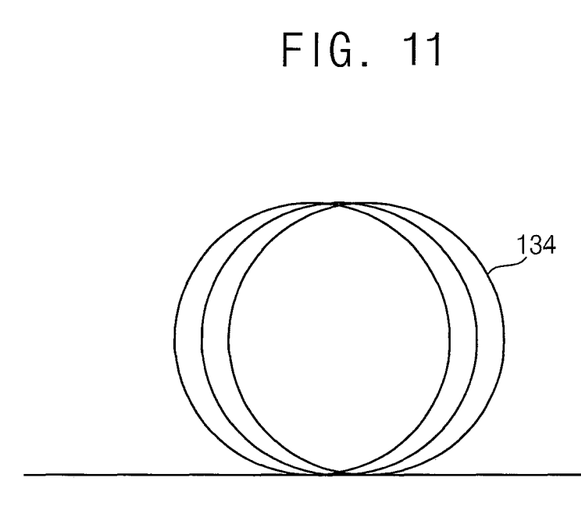
FIG. 11 is a view illustrating a highly nonlinear optical fiber used as a spectrum modulator of the laser apparatus in FIG. 1.
Figure 12:
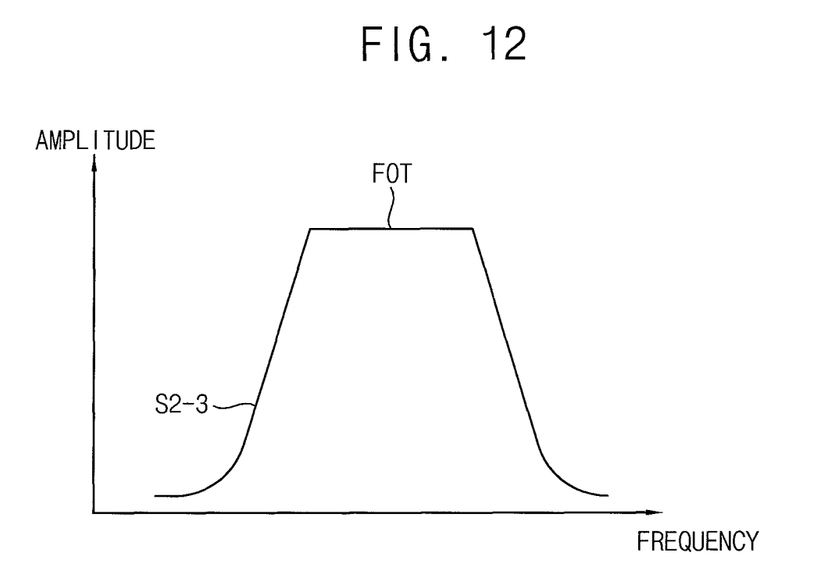
FIG. 12 is a view illustrating a spectrum having a flat top by the highly nonlinear optical fiber in FIG. 11.
Figure 13:
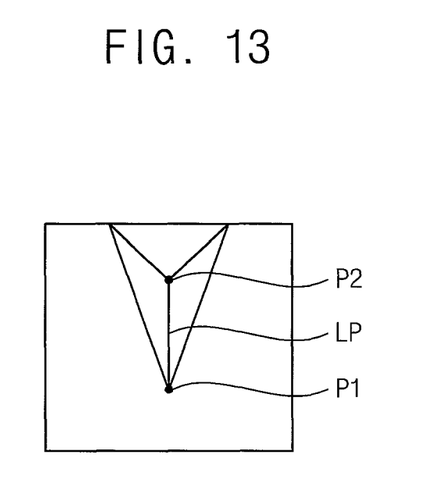
FIG. 13 is a view illustrating a linearly concentrated spectrum in FIG. 12.

FIG. 11 is a view illustrating a highly nonlinear optical fiber used as a spectrum modulator of the laser apparatus in FIG. 1, FIG. 12 is a view illustrating a spectrum having a flat top by the highly nonlinear optical fiber in FIG. 11, and FIG. 13 is a view illustrating a linearly concentrated spectrum in FIG. 12.

Referring to FIGS. 11 and 12, the spectrum modulator 130 may include a highly nonlinear optical fiber 134. The highly nonlinear optical fiber 134 may provide the laser beam with a wideband. Thus, when the first laser beam L1 formed by the spectrum controller 120 passes through the highly nonlinear optical fiber 134, the first spectrum S1 of the first laser beam L1 may be changed into a second spectrum S2-3 having a non-Gaussian shape. However, the spectrum modulator 130 may include other optical elements that, in addition to the highly nonlinear optical fiber 134, can convert the laser beam into a laser beam having the non-Gaussian shape.

For example, the first spectrum S1 may be converted into the second spectrum S2-3 having a flat top F0T by the highly nonlinear optical fiber 134. For example, the first laser beam L1 having the first spectrum S1 may be converted into the second laser beam L2 having the flat top F0T. Therefore, as shown in FIG. 13, the second laser beam L2 having the flat top F0T may be linearly concentrated on a portion between the first point P1 and the second point P2. Most of the second laser beam L2 having the flat top F0T may be absorbed in the substrate without scattering of the second laser beam L2 from the substrate.

Apparatus for Dicing a Substrate

Figure 14:
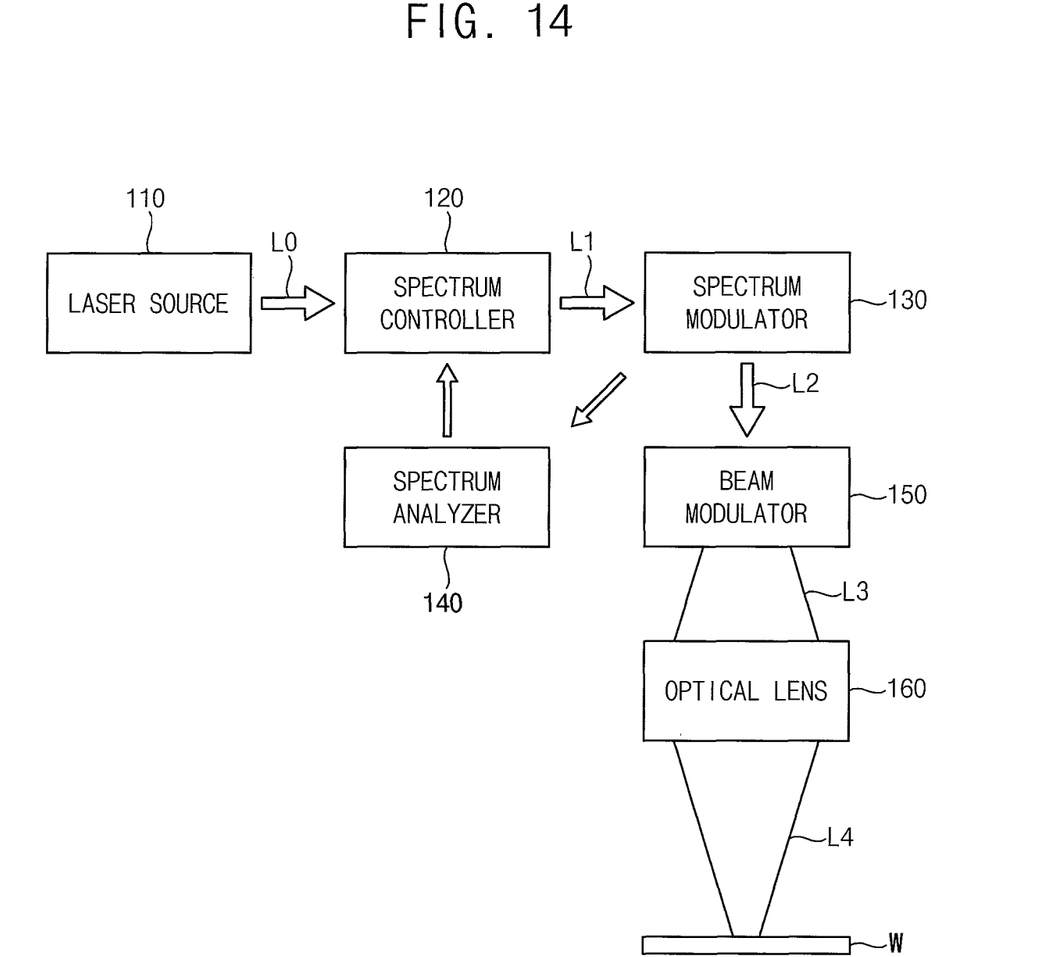
FIG. 14 is a block diagram illustrating an apparatus for dicing a substrate including the laser apparatus in FIG. 1.

FIG. 14 is a block diagram illustrating an apparatus for dicing a substrate including the laser apparatus in FIG. 1.

An apparatus for dicing a substrate in accordance with example embodiments may include elements substantially the same as those of the laser apparatus in FIG. 1 except for further including a beam modulator and an optical lens. Thus, the same reference numerals may refer to the same elements and any further illustrations with respect to the same elements may be omitted herein for brevity.

Referring to FIG. 14, the apparatus for dicing the substrate may include the laser source 110, the spectrum controller 120, the spectrum modulator 130, the spectrum analyzer 140, the beam modulator 150, and the optical lens 160.

In example embodiments, the laser beam L0 may be used for dicing the substrate W. The laser beam L0 may be irradiated to a scribe lane of the substrate W. The substrate W may include a semiconductor substrate including a plurality of semiconductor chips. Alternatively, the substrate W may include a glass substrate.

When the substrate W is diced using the laser beam, a cut line in the scribe lane of the substrate W may be readily formed using the laser beam so that a process time may be decreased. Further, influences on a crystal of the semiconductor layer in the semiconductor substrate W may be reduced compared than those generated in a mechanical machining process. The laser beam may cut the substrate W in a non-contact manner so that noises and vibrations may not be generated, loss of the substrate W may be minimized, and the dicing process may be completed in a short time. Furthermore, because of the non-contact dicing, although the substrate W may have a thin thickness, the laser beam may not generate cracks caused by a physical load. The laser beam may be irradiated to the substrate W in various directions so that cut lines extended in the various directions may be formed in the substrate W. The cut line may have a narrow width so that a yield of a semiconductor device may be improved.

The beam modulator 150 may modulate the second laser beam L2 formed by the spectrum modulator 130 to form a third laser beam L3.

The optical lens 160 may be arranged between the beam modulator 150 and the substrate W. The optical lens 160 may focus the third laser beam L3 formed by the beam modulator 150 to form a fourth laser beam L4. The fourth laser beam L4 may be irradiated to the substrate W.

In example embodiments, the fourth laser beam L4 may be used in a stealth dicing process. In this case, the fourth laser beam L4 may be concentrated on an inside portion of the substrate W, particularly, an inside portion of the scribe lane. As used herein, an "inside portion" may refer to a portion below the surface of the substrate W or scribe line. A converging point of the fourth laser beam L4 may be located inside of the scribe lane. Thus, a crack may be generated in the substrate W to which the fourth laser beam L4 may be irradiated. The crack may spread along the scribe lane so that the substrate W may be cut along the scribe lane. Alternatively, the fourth laser beam L4 may be focused on a surface of the substrate W, particularly, a surface of the scribe lane. In this case, a light-converging point of the fourth laser beam L4 may be located on the surface of the scribe lane in the substrate W.

In example embodiments, the laser beam generated from the laser apparatus in FIG. 1 may be used for dicing the substrate W. Alternatively, the laser beam generated from the laser apparatus in FIG. 1 may be used in other semiconductor fabrication processes.

Method of Dicing a Substrate

Figure 15:
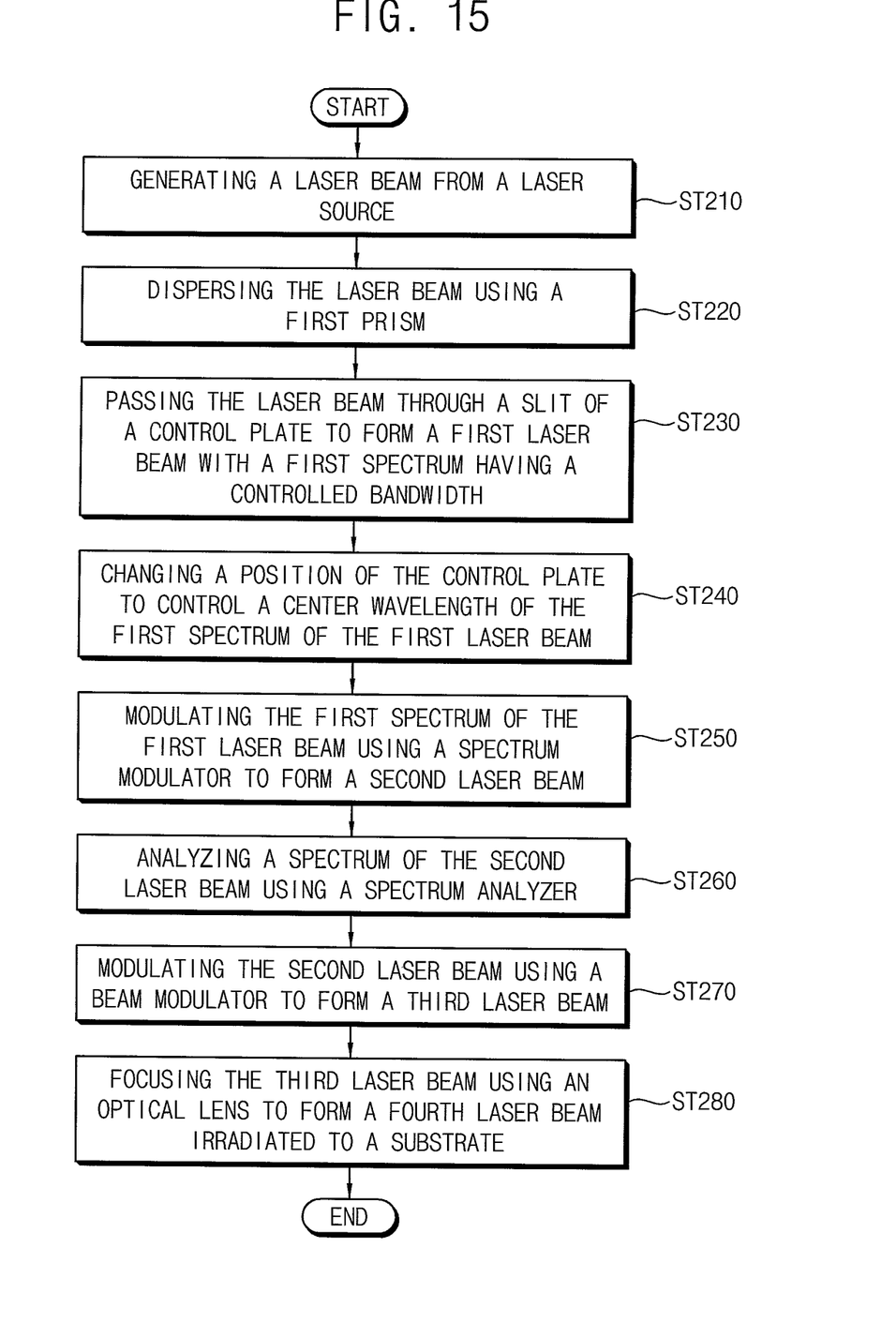
FIG. 15 is a flow chart illustrating a method of dicing a substrate using the apparatus in FIG. 14.

FIG. 15 is a flow chart illustrating a method of dicing a substrate using the apparatus in FIG. 14.

Referring to FIGS. 14 and 15, in step ST200, the laser source 110 may generate the laser beam L0. The laser beam L0 may then be incident on the spectrum controller 120.

In step ST210, the first prism 121 of the spectrum controller 120 may disperse the laser beam L0 by wavelengths. The dispersed laser beam L0 may then be incident on the second prism 122.

In step ST220, the second prism 122 may disperse the dispersed laser beam L0 to provide the dispersed laser beam L0 with the directionality substantially perpendicular to the surface of the control plate 123. For example, the dispersed laser beam L0 may have a directionality that is substantially orthogonal to the surface of the control plate 123. Thus, the dispersed laser beam L0 may be vertically incident on the surface of the control plate 123.

In step ST230, the laser beam L0 may pass through the slit 124 of the control plate 123 to form the first laser beam L1. The first spectrum S1 of the first laser beam L1 may have the first bandwidth B1 narrower than the bandwidth B0 of the spectrum S0 of the laser beam L0. The first laser beam L1 may be focused at the first point P1. The size of the slit 124 may be changed according to the desired dicing processes. That is, the optimal first laser beam L1 may be formed by changing the size of the slit 124.

In step ST240, the control plate 123 may be moved along the vertical direction. The vertical position of the slit 124 may be changed by moving the control plate 123. When the laser beam L0 passes through the slit 124 of the control plate 123, the first spectrum S1 of the first laser beam L1 may have the first center wavelength C1 located to the right of the center wavelength C0 of the laser beam L0. Therefore, the first laser beam L1 having the first center wavelength C1 optimal for the dicing process may be formed by vertically moving the control plate 123. The first laser beam L1 may then be incident on the spectrum modulator 130.

In step ST250, the spectrum modulator 130 may modulate the first spectrum S1 of the first laser beam L1 to form the second laser beam L2.

When the spectrum modulator 130 includes the Raman optical fiber 132, the Raman optical fiber 132 may change the first spectrum S1 of the first laser beam L1 into the second laser beam L1 having two second spectrums S2-1 and S2-2. That is, the Raman optical fiber 132 may convert the first laser beam L1 having one first center wavelength C1 into the second laser beam L2 having the two center wavelengths.

When the spectrum modulator 130 includes the highly nonlinear optical fiber 134, the highly nonlinear optical fiber 134 may change the first spectrum S1 of the first laser beam L1 into the second spectrum S2-3 having the non-Gaussian shape. For example, the highly nonlinear optical fiber 134 may change the first spectrum S1 into the second spectrum S2-3 having the flat top FT.

In step ST260, the spectrum analyzer 140 may analyze the spectrum of the second laser beam L2 modulated by the spectrum modulator 130. The information of the spectrum of the second laser beam L2 obtained by the spectrum analyzer 140 may be transmitted to the spectrum controller 120.

In step ST270, the beam modulator 150 may modulate the second laser beam L2 formed by the spectrum modulator 130 to form the third laser beam L3.

In step ST280, the optical lens 160 may focus the third laser beam L3 formed by the beam modulator 150 to form the fourth laser beam L4. The fourth laser beam L4 may then be irradiated to the substrate W. The fourth laser beam L4 may be incident on the inside or the surface of the substrate W.

Figure 16:
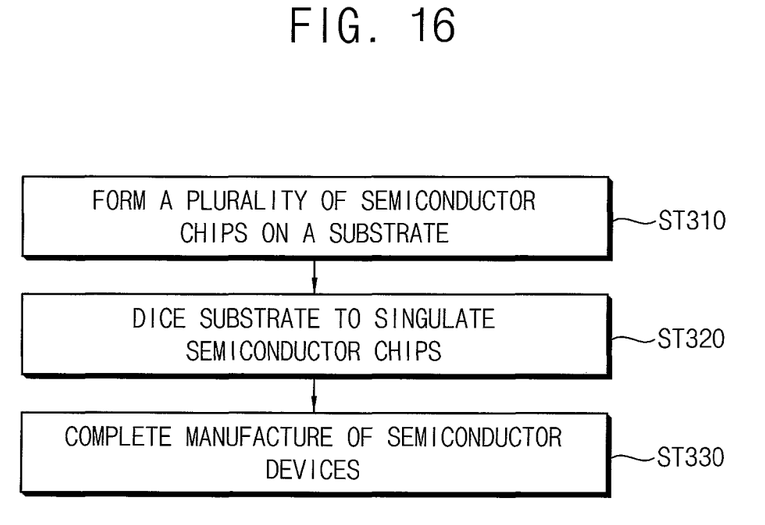
FIG. 16 is a method of manufacturing semiconductor devices using the method of dicing a substrate, according to example embodiments.

FIG. 16 illustrates a method of manufacturing semiconductor devices using the method of dicing a substrate, according to certain exemplary embodiments.

First, in step ST310, a plurality of semiconductor chips may be formed on a substrate. The formation of the plurality of semiconductor chips may include one or more processes, such as, for example, deposition processes, etching processes, photolithography processes, CMP processes, etc. Each of the plurality of semiconductor chips may be substantially the same. For example, the plurality of semiconductor chips may be a same type of chip, each having insulating layers that are substantially the same in shape, size, and production processes with one another.

Next, in step ST320, the substrate having the plurality of semiconductor chips may be diced according to the systems and processes discloses herein. For example, the substrate having the plurality of semiconductor chips may be diced in accordance with the method of dicing a substrate of FIG. 15, to provide a plurality of singulated semiconductor chips.

In step ST330, additional processing may be performed. For example, the singulated semiconductor chips may be packaged on a package substrate, and encapsulated by an encapsulant to form a semiconductor device. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

According to example embodiments, the center wavelength and/or the bandwidth of the spectrum of the laser beam may be controlled so that the laser beam may have the spectrum optimal for a semiconductor fabrication process. Particularly, the substrate may be accurately diced using the laser beam having the optimal spectrum.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of dicing a substrate, the method comprising:
controlling at least one of a center wavelength and a bandwidth of a spectrum of a laser beam;
modulating the spectrum of the laser beam, and
focusing the laser beam, which has the spectrum having the at least one of the center wavelength and the bandwidth controlled by a spectrum controller, on the substrate,
wherein the controlling the center wavelength comprises:
dispersing the laser beam toward a control plate having a slit using a first prism;
providing the dispersed laser beam with a directionality substantially perpendicular to a surface of the control plate using a second prism; and
passing the dispersed laser beam through the slit with changing positions of the control plate.

2. The method of claim 1, wherein controlling the bandwidth comprises passing the dispersed laser beam through the slit with changing sizes of the slit.

3. The method of claim 1, wherein modulating the spectrum of the laser beam comprises dividing the center wavelength of the spectrum into at least two center wavelengths.

4. The method of claim 1, wherein focusing the laser beam on the substrate comprises focusing the laser beam on an inside of the substrate.

* * * * *